(12) United States Patent
Hiner et al.

(10) Patent No.: US 8,390,130 B1
(45) Date of Patent: Mar. 5, 2013

(54) THROUGH VIA RECESSED REVEAL STRUCTURE AND METHOD

(75) Inventors: David Jon Hiner, Chandler, AZ (US); Ronald Patrick Huemoeller, Gilbert, AZ (US); Michael G. Kelly, Queen Creek, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 105 days.

(21) Appl. No.: 12/985,888

(22) Filed: Jan. 6, 2011

(51) Int. Cl.
*H01L 23/48* (2006.01)

(52) U.S. Cl. . 257/774; 257/621; 257/686; 257/E21.597; 257/E25.006; 438/109; 438/629; 438/637

(58) Field of Classification Search .................. 257/698, 257/686, 737, E23.021, E23.069, E25.006, 257/E25.021, E25.027, E23.085, 621, 774; 438/109, FOR. 368, FOR. 426, 629, 637–640, 438/668, 672, 675
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

Kim et al., "Application of Through Mold Via (TMV) as PoP base package", *58th ECTC Proceedings*, May 2008, Lake Buena Vista, FL, 6 pages, IEEE.

(Continued)

*Primary Examiner* — Jasmine Clark
(74) *Attorney, Agent, or Firm* — McKay and Hodgson, LLP; Serge J. Hodgson

(57) ABSTRACT

A stacked assembly includes a stacked structure stacked on a through via recessed reveal structure. The through via recessed reveal structure includes recesses within a backside surface of an electronic component that expose backsides of through vias. Pillars of the stacked structure are attached to the exposed backsides of the through vias through the recesses. The recesses in combination with the pillars work as a lock and key arrangement to insure self-alignment of the pillars with the backsides of the through vias allowing fine pitch interconnections to be realized. Further, by forming the interconnections to the backsides of the through vias within the recesses, the overall thickness of the stacked assembly is minimized. Further still, by forming the interconnections to the backsides of the through vias within the recesses, shorting between adjacent through vias is minimized or eliminated.

17 Claims, 9 Drawing Sheets

U.S. PATENT DOCUMENTS

| | | | |
|---|---|---|---|
| 4,646,710 A | 3/1987 | Schmid et al. | |
| 4,707,724 A | 11/1987 | Suzuki et al. | |
| 4,727,633 A | 3/1988 | Herrick | |
| 4,729,061 A | 3/1988 | Brown | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,118,298 A | 6/1992 | Murphy | |
| 5,122,860 A | 6/1992 | Kikuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, III et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,229,647 A | 7/1993 | Gnadinger | |
| 5,245,751 A | 9/1993 | Locke et al. | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,268,310 A | 12/1993 | Goodrich et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,353,498 A | 10/1994 | Fillion et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,394,303 A | 2/1995 | Yamaji | |
| 5,406,124 A | 4/1995 | Morita et al. | |
| 5,410,180 A | 4/1995 | Fuji et al. | |
| 5,414,299 A | 5/1995 | Wang et al. | |
| 5,417,905 A | 5/1995 | Lemaire et al. | |
| 5,424,576 A | 6/1995 | Djennas et al. | |
| 5,428,248 A | 6/1995 | Cha | |
| 5,432,677 A | 7/1995 | Mowatt et al. | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,576,517 A | 11/1996 | Wojnarowski et al. | |
| 5,578,525 A | 11/1996 | Mizukoshi | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,264 A | 3/1997 | Gaul | |
| 5,608,265 A | 3/1997 | Kitano et al. | |
| 5,608,267 A | 3/1997 | Mahulikar et al. | |
| 5,619,068 A | 4/1997 | Benzoni | |
| 5,625,222 A | 4/1997 | Yoneda et al. | |
| 5,633,528 A | 5/1997 | Abbott et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita et al. | |
| 5,736,432 A | 4/1998 | Mackessy | |
| 5,736,448 A | 4/1998 | Saia et al. | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,769,989 A | 6/1998 | Hoffmeyer et al. | |
| 5,770,888 A | 6/1998 | Song et al. | |
| 5,776,798 A | 7/1998 | Quan et al. | |
| 5,783,861 A | 7/1998 | Son | |
| 5,786,238 A | 7/1998 | Pai et al. | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,841,193 A | 11/1998 | Eichelberger | |
| 5,844,306 A | 12/1998 | Fujita et al. | |
| 5,856,911 A | 1/1999 | Riley | |
| 5,859,471 A | 1/1999 | Kuraishi et al. | |
| 5,859,475 A | 1/1999 | Freyman et al. | |
| 5,866,939 A | 2/1999 | Shin et al. | |
| 5,871,782 A | 2/1999 | Choi | |
| 5,874,770 A | 2/1999 | Saia et al. | |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |

| Patent Number | Kind | Date | Inventor |
|---|---|---|---|
| 5,903,049 | A | 5/1999 | Mori |
| 5,903,050 | A | 5/1999 | Thurairajaratnam et al. |
| 5,909,053 | A | 6/1999 | Fukase et al. |
| 5,915,998 | A | 6/1999 | Stidham et al. |
| 5,917,242 | A | 6/1999 | Ball |
| 5,937,324 | A | 8/1999 | Abercrombie et al. |
| 5,939,779 | A | 8/1999 | Kim |
| 5,942,794 | A | 8/1999 | Okumura et al. |
| 5,951,305 | A | 9/1999 | Haba |
| 5,959,356 | A | 9/1999 | Oh |
| 5,969,426 | A | 10/1999 | Baba et al. |
| 5,973,388 | A | 10/1999 | Chew et al. |
| 5,976,912 | A | 11/1999 | Fukutomi et al. |
| 5,977,613 | A | 11/1999 | Takata et al. |
| 5,977,615 | A | 11/1999 | Yamaguchi et al. |
| 5,977,630 | A | 11/1999 | Woodworth et al. |
| 5,981,314 | A | 11/1999 | Glenn et al. |
| 5,982,632 | A | 11/1999 | Mosley et al. |
| 5,986,333 | A | 11/1999 | Nakamura |
| 5,986,885 | A | 11/1999 | Wyland |
| 6,001,671 | A | 12/1999 | Fjelstad |
| 6,013,947 | A | 1/2000 | Lim |
| 6,018,189 | A | 1/2000 | Mizuno |
| 6,020,625 | A | 2/2000 | Qin et al. |
| 6,025,640 | A | 2/2000 | Yagi et al. |
| 6,031,279 | A | 2/2000 | Lenz |
| RE36,613 | E | 3/2000 | Ball |
| 6,034,423 | A | 3/2000 | Mostafazadeh et al. |
| 6,040,626 | A | 3/2000 | Cheah et al. |
| 6,043,430 | A | 3/2000 | Chun |
| 6,060,768 | A | 5/2000 | Hayashida et al. |
| 6,060,769 | A | 5/2000 | Wark |
| 6,072,228 | A | 6/2000 | Hinkle et al. |
| 6,075,284 | A | 6/2000 | Choi et al. |
| 6,081,029 | A | 6/2000 | Yamaguchi |
| 6,084,310 | A | 7/2000 | Mizuno et al. |
| 6,087,715 | A | 7/2000 | Sawada et al. |
| 6,087,722 | A | 7/2000 | Lee et al. |
| 6,100,594 | A | 8/2000 | Fukui et al. |
| 6,113,474 | A | 9/2000 | Shih et al. |
| 6,114,752 | A | 9/2000 | Huang et al. |
| 6,118,174 | A | 9/2000 | Kim |
| 6,118,184 | A | 9/2000 | Ishio et al. |
| RE36,907 | E | 10/2000 | Templeton, Jr. et al. |
| 6,130,115 | A | 10/2000 | Okumura et al. |
| 6,130,473 | A | 10/2000 | Mostafazadeh et al. |
| 6,133,623 | A | 10/2000 | Otsuki et al. |
| 6,140,154 | A | 10/2000 | Hinkle et al. |
| 6,143,981 | A | 11/2000 | Glenn |
| 6,168,969 | B1 | 1/2001 | Farnworth |
| 6,169,329 | B1 | 1/2001 | Farnworth et al. |
| 6,177,718 | B1 | 1/2001 | Kozono |
| 6,181,002 | B1 | 1/2001 | Juso et al. |
| 6,184,465 | B1 | 2/2001 | Corisis |
| 6,184,573 | B1 | 2/2001 | Pu |
| 6,194,250 | B1 | 2/2001 | Melton et al. |
| 6,194,777 | B1 | 2/2001 | Abbott et al. |
| 6,197,615 | B1 | 3/2001 | Song et al. |
| 6,198,171 | B1 | 3/2001 | Huang et al. |
| 6,201,186 | B1 | 3/2001 | Daniels et al. |
| 6,201,292 | B1 | 3/2001 | Yagi et al. |
| 6,204,554 | B1 | 3/2001 | Ewer et al. |
| 6,208,020 | B1 | 3/2001 | Minamio et al. |
| 6,208,021 | B1 | 3/2001 | Ohuchi et al. |
| 6,208,023 | B1 | 3/2001 | Nakayama et al. |
| 6,211,462 | B1 | 4/2001 | Carter, Jr. et al. |
| 6,214,525 | B1 | 4/2001 | Boyko et al. |
| 6,218,731 | B1 | 4/2001 | Huang et al. |
| 6,222,258 | B1 | 4/2001 | Asano et al. |
| 6,222,259 | B1 | 4/2001 | Park et al. |
| 6,225,146 | B1 | 5/2001 | Yamaguchi et al. |
| 6,229,200 | B1 | 5/2001 | Mclellan et al. |
| 6,229,205 | B1 | 5/2001 | Jeong et al. |
| 6,239,367 | B1 | 5/2001 | Hsuan et al. |
| 6,239,384 | B1 | 5/2001 | Smith et al. |
| 6,242,281 | B1 | 6/2001 | Mclellan et al. |
| 6,256,200 | B1 | 7/2001 | Lam et al. |
| 6,258,192 | B1 | 7/2001 | Natarajan |
| 6,258,629 | B1 | 7/2001 | Niones et al. |
| 6,261,918 | B1 | 7/2001 | So |
| 6,281,566 | B1 | 8/2001 | Magni |
| 6,281,568 | B1 | 8/2001 | Glenn et al. |
| 6,282,095 | B1 | 8/2001 | Houghton et al. |
| 6,285,075 | B1 | 9/2001 | Combs et al. |
| 6,291,271 | B1 | 9/2001 | Lee et al. |
| 6,291,273 | B1 | 9/2001 | Miyaki et al. |
| 6,294,100 | B1 | 9/2001 | Fan et al. |
| 6,294,830 | B1 | 9/2001 | Fjelstad |
| 6,295,977 | B1 | 10/2001 | Ripper et al. |
| 6,297,548 | B1 | 10/2001 | Moden et al. |
| 6,303,984 | B1 | 10/2001 | Corisis |
| 6,303,997 | B1 | 10/2001 | Lee |
| 6,307,272 | B1 | 10/2001 | Takahashi et al. |
| 6,309,909 | B1 | 10/2001 | Ohgiyama |
| 6,316,822 | B1 | 11/2001 | Venkateshwaran et al. |
| 6,316,838 | B1 | 11/2001 | Ozawa et al. |
| 6,323,550 | B1 | 11/2001 | Martin et al. |
| 6,326,243 | B1 | 12/2001 | Suzuya et al. |
| 6,326,244 | B1 | 12/2001 | Brooks et al. |
| 6,326,678 | B1 | 12/2001 | Karnezos et al. |
| 6,335,564 | B1 | 1/2002 | Pour |
| 6,337,510 | B1 | 1/2002 | Chun-Jen et al. |
| 6,339,255 | B1 | 1/2002 | Shin |
| 6,348,726 | B1 | 2/2002 | Bayan et al. |
| 6,355,502 | B1 | 3/2002 | Kang et al. |
| 6,365,974 | B1 | 4/2002 | Abbott et al. |
| 6,369,447 | B2 | 4/2002 | Mori |
| 6,369,454 | B1 | 4/2002 | Chung |
| 6,373,127 | B1 | 4/2002 | Baudouin et al. |
| 6,379,982 | B1 | 4/2002 | Ahn et al. |
| 6,380,048 | B1 | 4/2002 | Boon et al. |
| 6,384,472 | B1 | 5/2002 | Huang |
| 6,388,336 | B1 | 5/2002 | Venkateshwaran et al. |
| 6,395,578 | B1 | 5/2002 | Shin et al. |
| 6,396,148 | B1 | 5/2002 | Eichelberger et al. |
| 6,396,153 | B2 | 5/2002 | Fillion et al. |
| 6,400,004 | B1 | 6/2002 | Fan et al. |
| 6,406,934 | B1 | 6/2002 | Glenn et al. |
| 6,410,979 | B2 | 6/2002 | Abe |
| 6,414,385 | B1 | 7/2002 | Huang et al. |
| 6,420,779 | B1 | 7/2002 | Sharma et al. |
| 6,429,508 | B1 | 8/2002 | Gang |
| 6,429,509 | B1 | 8/2002 | Hsuan |
| 6,437,429 | B1 | 8/2002 | Su et al. |
| 6,444,499 | B1 | 9/2002 | Swiss et al. |
| 6,448,633 | B1 | 9/2002 | Yee et al. |
| 6,448,661 | B1 | 9/2002 | Kim et al. |
| 6,452,279 | B2 | 9/2002 | Shimoda |
| 6,459,148 | B1 | 10/2002 | Chun-Jen et al. |
| 6,464,121 | B2 | 10/2002 | Reijnders |
| 6,476,469 | B2 | 11/2002 | Hung et al. |
| 6,476,474 | B1 | 11/2002 | Hung |
| 6,482,680 | B1 | 11/2002 | Khor et al. |
| 6,498,099 | B1 | 12/2002 | McLellan et al. |
| 6,498,392 | B2 | 12/2002 | Azuma |
| 6,507,096 | B2 | 1/2003 | Gang |
| 6,507,120 | B2 | 1/2003 | Lo et al. |
| 6,521,530 | B2 | 2/2003 | Peters et al. |
| 6,524,885 | B2 | 2/2003 | Pierce |
| 6,534,849 | B1 | 3/2003 | Gang |
| 6,545,332 | B2 | 4/2003 | Huang |
| 6,545,345 | B1 | 4/2003 | Glenn et al. |
| 6,559,525 | B2 | 5/2003 | Huang |
| 6,566,168 | B2 | 5/2003 | Gang |
| 6,573,461 | B2 | 6/2003 | Roeters et al. |
| 6,577,013 | B1 | 6/2003 | Glenn et al. |
| 6,583,503 | B2 | 6/2003 | Akram et al. |
| 6,593,645 | B2 | 7/2003 | Shih et al. |
| 6,603,196 | B2 | 8/2003 | Lee et al. |
| 6,608,371 | B2 | 8/2003 | Kurashima et al. |
| 6,624,005 | B1 | 9/2003 | DiCaprio et al. |
| 6,667,546 | B2 | 12/2003 | Huang et al. |
| 6,671,398 | B2 | 12/2003 | Reinhorn et al. |
| 6,727,576 | B2 | 4/2004 | Hedler et al. |
| 6,730,857 | B2 | 5/2004 | Konrad et al. |
| 6,740,964 | B2 | 5/2004 | Sasaki |
| 6,780,770 | B2 | 8/2004 | Larson |
| 6,831,371 | B1 | 12/2004 | Huemoeller et al. |

| | | | |
|---|---|---|---|
| 6,838,776 B2 | 1/2005 | Leal et al. | |
| 6,845,554 B2 | 1/2005 | Frankowsky et al. | |
| 6,853,572 B1 | 2/2005 | Sabharwal | |
| 6,873,054 B2 | 3/2005 | Miyazawa et al. | |
| 6,905,914 B1 | 6/2005 | Huemoeller et al. | |
| 6,919,514 B2 | 7/2005 | Konrad et al. | |
| 6,921,975 B2 | 7/2005 | Leal et al. | |
| 6,930,256 B1 | 8/2005 | Huemoeller et al. | |
| 7,015,075 B2 | 3/2006 | Fay et al. | |
| 7,022,609 B2 | 4/2006 | Yamamoto et al. | |
| 7,041,534 B2 | 5/2006 | Chao et al. | |
| 7,129,158 B2 | 10/2006 | Nakai | |
| 7,151,009 B2 | 12/2006 | Kim et al. | |
| 7,190,062 B1 | 3/2007 | Sheridan et al. | |
| 7,192,807 B1 | 3/2007 | Huemoeller et al. | |
| 7,208,838 B2 | 4/2007 | Masuda | |
| 7,223,634 B2 | 5/2007 | Yamaguchi | |
| 7,242,081 B1 | 7/2007 | Lee | |
| 7,247,523 B1 | 7/2007 | Huemoeller et al. | |
| 7,272,444 B2 | 9/2007 | Peterson et al. | |
| 7,345,361 B2 | 3/2008 | Mallik et al. | |
| 7,361,533 B1 | 4/2008 | Huemoeller et al. | |
| 7,372,151 B1 | 5/2008 | Fan et al. | |
| 7,420,272 B1 | 9/2008 | Huemoeller et al. | |
| 7,572,681 B1 | 8/2009 | Huemoeller et al. | |
| 7,632,753 B1 | 12/2009 | Rusli et al. | |
| 7,692,286 B1 | 4/2010 | Huemoeller et al. | |
| 7,714,431 B1 | 5/2010 | Huemoeller et al. | |
| 7,723,210 B2 | 5/2010 | Berry et al. | |
| 7,777,351 B1 | 8/2010 | Berry et al. | |
| 7,843,052 B1 | 11/2010 | Yoo et al. | |
| 7,843,072 B1 | 11/2010 | Park et al. | |
| 7,902,660 B1 | 3/2011 | Lee et al. | |
| 7,932,595 B1 | 4/2011 | Huemoeller et al. | |
| 2001/0008305 A1 | 7/2001 | McLellan et al. | |
| 2001/0011654 A1 | 8/2001 | Schmidt et al. | |
| 2001/0012704 A1 | 8/2001 | Eldridge | |
| 2001/0014538 A1 | 8/2001 | Kwan et al. | |
| 2002/0017710 A1 | 2/2002 | Kurashima et al. | |
| 2002/0024122 A1 | 2/2002 | Jung et al. | |
| 2002/0027297 A1 | 3/2002 | Ikenaga et al. | |
| 2002/0030245 A1 | 3/2002 | Hanaoka et al. | |
| 2002/0061642 A1 | 5/2002 | Haji et al. | |
| 2002/0140061 A1 | 10/2002 | Lee | |
| 2002/0140068 A1 | 10/2002 | Lee et al. | |
| 2002/0163015 A1 | 11/2002 | Lee et al. | |
| 2003/0013232 A1 | 1/2003 | Towle et al. | |
| 2003/0030131 A1 | 2/2003 | Lee et al. | |
| 2003/0038344 A1 | 2/2003 | Palmer et al. | |
| 2003/0064548 A1 | 4/2003 | Isaak | |
| 2003/0073265 A1 | 4/2003 | Hu et al. | |
| 2003/0134455 A1 | 7/2003 | Cheng et al. | |
| 2003/0207566 A1* | 11/2003 | Forbes et al. | 438/667 |
| 2004/0004293 A1 | 1/2004 | Murayama | |
| 2004/0026781 A1 | 2/2004 | Nakai | |
| 2004/0046244 A1 | 3/2004 | Nakamura et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0113260 A1 | 6/2004 | Sunohara et al. | |
| 2004/0192033 A1 | 9/2004 | Hara | |
| 2004/0251554 A1 | 12/2004 | Masuda | |
| 2005/0029630 A1 | 2/2005 | Matsuo | |
| 2005/0046002 A1 | 3/2005 | Lee et al. | |
| 2005/0104181 A1 | 5/2005 | Lee et al. | |
| 2005/0242425 A1 | 11/2005 | Leal et al. | |
| 2005/0263869 A1* | 12/2005 | Tanaka et al. | 257/686 |
| 2005/0282314 A1 | 12/2005 | Lo et al. | |
| 2007/0007639 A1 | 1/2007 | Fukazawa | |
| 2007/0273049 A1 | 11/2007 | Khan et al. | |
| 2007/0290376 A1 | 12/2007 | Zhao et al. | |
| 2008/0230887 A1 | 9/2008 | Sun et al. | |
| 2008/0277799 A1 | 11/2008 | Benson et al. | |
| 2009/0020865 A1 | 1/2009 | Su | |
| 2009/0039527 A1 | 2/2009 | Chan et al. | |
| 2010/0008058 A1 | 1/2010 | Saen et al. | |
| 2012/0018868 A1 | 1/2012 | Oganesian et al. | |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Huemoeller et al., "Embedded Electronic Component Package Fabrication Method", U.S. Appl. No. 12/459,532, filed Jul. 2, 2009.

Berry et al., "Direct-Write Wafer Level Chip Scale Package", U.S. Appl. No. 12/661,597, filed Mar. 19, 2010.

Huemoeller et al., "Through Via Nub Reveal Method and Structure", U.S. Appl. No. 12/754,837, filed Apr. 6, 2010.

Hiner et al., "Through Via Connected Backside Embedded Circuit Features Structure and Method", U.S. Appl. No. 12/848,820, filed Aug. 2, 2010.

Do et al., "Semiconductor Device and Manufacturing Method Thereof", U.S. Appl. No. 12/898,192, filed Oct. 5, 2010.

* cited by examiner

Through via recessed reveal structure formation method 100

Through via recessed reveal structure formation method 700

THROUGH VIA RECESSED REVEAL STRUCTURE AND METHOD

TECHNICAL FIELD

The present application relates to the field of electronics, and more particularly, to methods of forming electronic component packages and related structures.

BACKGROUND

To allow backside contact to an electronic component such as an integrated circuit die, electrically conductive through vias are formed in the electronic component. The through vias extend entirely through the electronic component from the active surface to the inactive surface of electronic component. Electrical connections to the through vias at the inactive surface of the electronic component are then possible.

BRIEF DESCRIPTION OF THE DRAWINGS

In the following description, the same or similar elements are labeled with the same or similar reference numbers.

DETAILED DESCRIPTION

Figure 6:
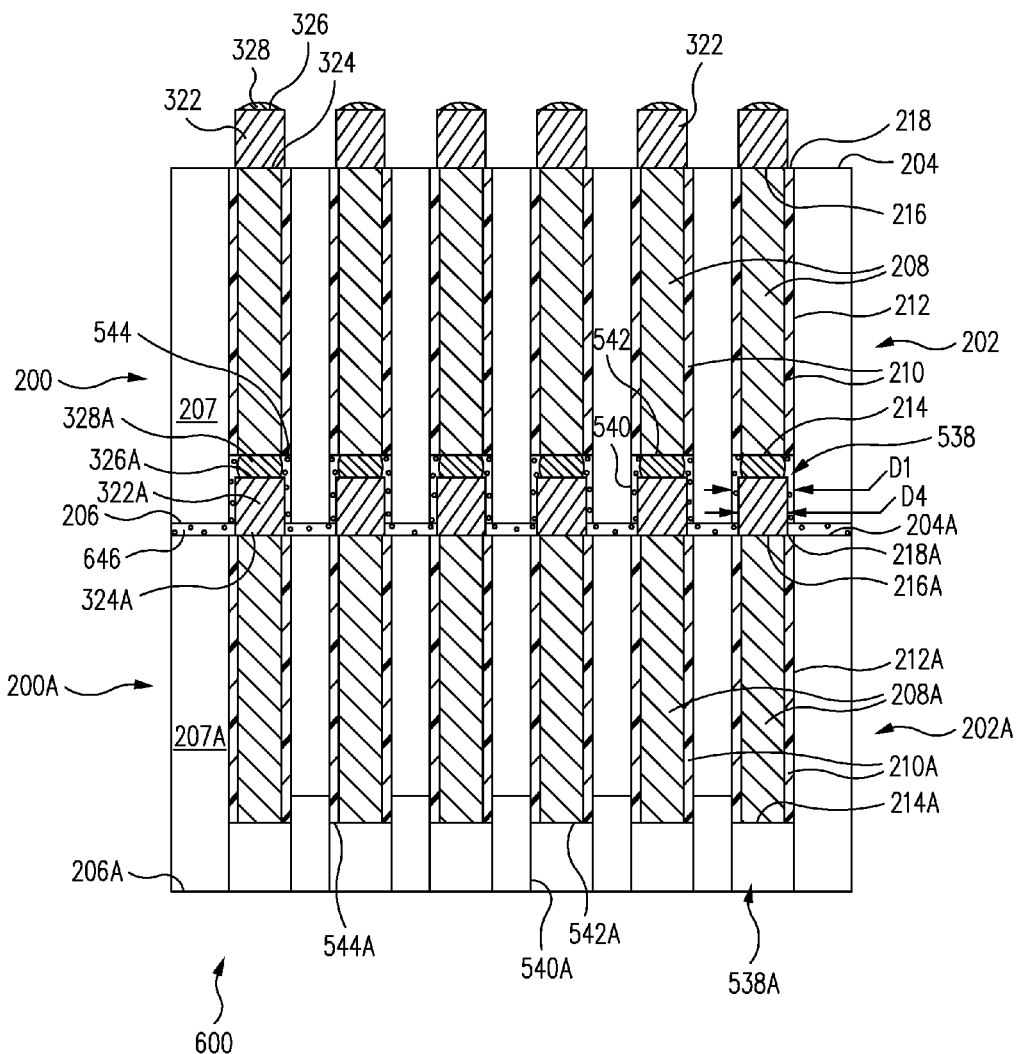
FIG. 6 is a cross-sectional view of a stacked assembly including the through via recessed reveal structure of FIG. 5 at a later stage during fabrication in accordance with one embodiment.

As an overview and in accordance with one embodiment, referring to FIG. 6, a stacked assembly 600 includes a stacked structure 200A stacked on a through via recessed reveal structure 200. The through via recessed reveal structure 200 includes recesses 538 within a backside surface 206 of an electronic component 202 that expose backsides 214 of through vias 208. Pillars 322A of stacked structure 200A are attached to the exposed backsides 214 of through vias 208 through recesses 538.

Recesses 538 in combination with pillars 322A work as a lock and key arrangement to insure self-alignment of pillars 322A with backsides 214 of through vias 208 allowing fine pitch interconnections to be realized. Further, by forming the interconnections to backsides 214 of through vias 208 within recesses 538, the overall thickness of stacked assembly 600 is minimized. Further still, by forming the interconnections to backsides 214 of through vias 208 within recesses 538, shorting between adjacent through vias 208 is minimized or eliminated.

Figure 1:
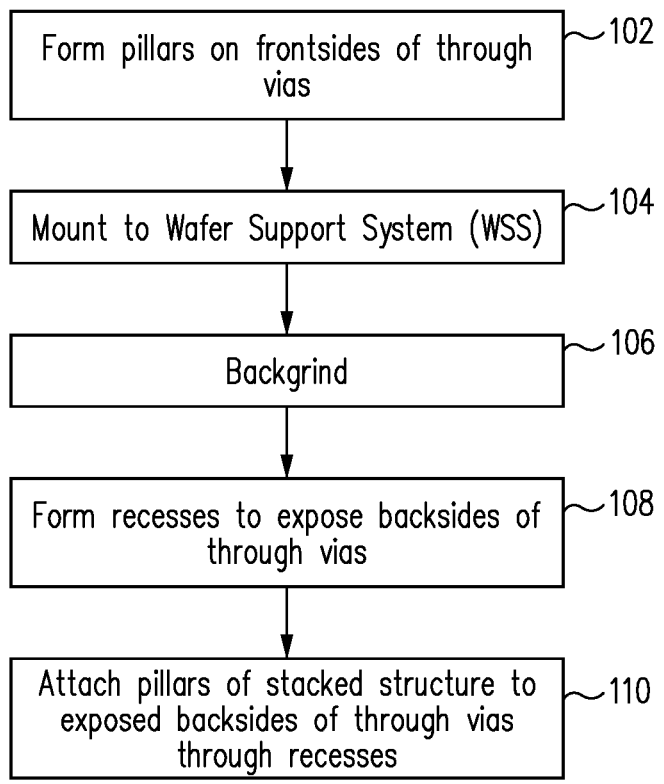
FIG. 1 is a block diagram of a through via recessed reveal structure formation method in accordance with one embodiment.
Figure 2:
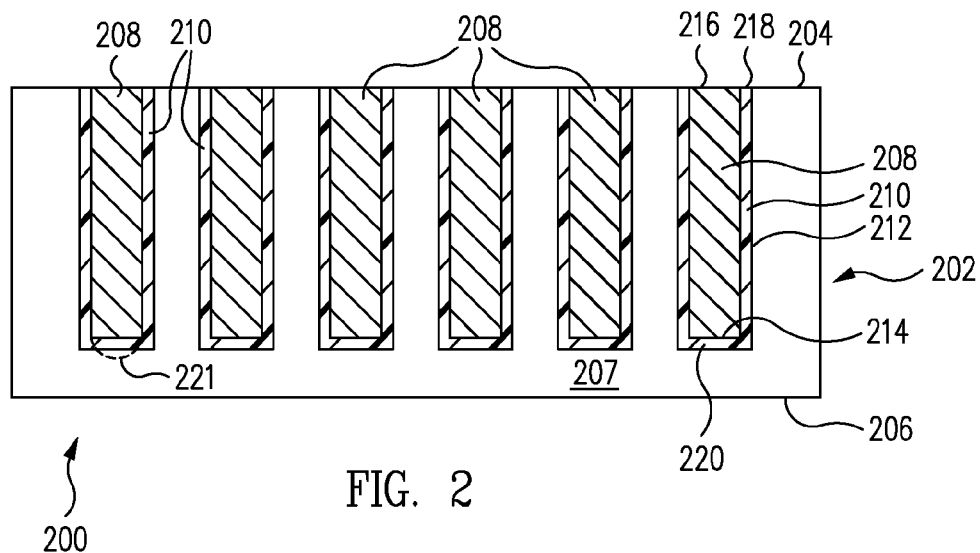
FIG. 2 is a cross-sectional view of a through via recessed reveal structure during fabrication in accordance with one embodiment.

Now in more detail, FIG. 1 is a block diagram of a through via recessed reveal structure formation method 100 in accordance with one embodiment. FIG. 2 is a cross-sectional view of a through via recessed reveal structure 200 during fabrication in accordance with one embodiment.

Through via recessed reveal structure 200 includes an electronic component 202. In one embodiment, electronic component 202 is an integrated circuit chip, e.g., an active component. However, in other embodiments, electronic component 202 is a passive component such as a capacitor, resistor, or inductor.

In accordance with this embodiment, electronic component 202 includes a frontside surface 204 and an opposite backside surface 206. In one embodiment, frontside surface 204 is the active surface of electronic component 202 that includes the electronic devices, e.g., transistors, of electronic component 202. Electronic component 202 is formed of a bulk 207, e.g., silicon. Generally, bulk 207 extends between frontside surface 204 and backside surface 206.

Through via recessed reveal structure 200 further includes through vias 208 formed in electronic component 202. Through vias 208, sometimes called Through Silicon Vias or TSVs, are enclosed within dielectric sheaths 210.

Illustratively, through via apertures 212 are formed, e.g., by laser drilling, into electronic component 202 from frontside surface 204. Dielectric sheaths 210, e.g., silicon oxide, are formed on the sidewalls of through via apertures 212. In one embodiment, bulk 207, e.g., silicon, of electronic component 202 exposed within through via apertures 212 is oxidized to form dielectric sheaths 210. In another embodiment, a dielectric material is deposited within through via apertures 212 to form dielectric sheaths 210.

Through vias 208 are formed within dielectric sheaths 210. Illustratively, an electrically conductive material, e.g., copper or tungsten, is deposited, e.g., plated, within dielectric sheaths 210 to form through vias 208. Dielectric sheaths 210 electrically isolate through vias 208 from bulk 207 of electronic component 202.

Through vias 208 remain enclosed within bulk 207 of electronic component 202 at backside surface 206. As illustrated in FIG. 2, through vias 208 have backsides 214 buried within electronic component 202 such that bulk 207 of electronic component 202 remains between backsides 214 of through vias 208 and backside surface 206 of electronic component 202. Through vias 208 further include frontsides 216 that are coplanar with and parallel to frontside surface 204 of electronic component 202.

Frontsides 216 are surrounded by annular frontside dielectric sheath ends 218. Frontsides 216 are the upper circular ends of through vias 208 and thus are electrically conductive. Frontside dielectric sheath ends 218 are the upper annular ends of dielectric sheaths 210 and thus are a dielectric.

Dielectric sheaths 210 are hollow cylinders and through vias 208 are solid cylinders formed within dielectric sheaths 210. Through vias 208 are cylindrical in shape although may taper slightly between frontsides 216 and backsides 214.

Through vias 208 extend between frontsides 216 and backsides 214 in a direction perpendicular to frontside surface 204 and backside surface 206 of electronic component 202. Although the terms parallel, perpendicular, and similar terms are used herein to describe various features, in light of this disclosure, those of skill in the art will understand that the features may not be exactly parallel or perpendicular but only substantially parallel or perpendicular to within accepted manufacturing tolerances.

Except at frontsides 216, through vias 208 are totally enclosed within dielectric sheaths 210. As illustrated in FIG. 2, backsides 214 of through vias 208 are parallel to but spaced apart from backside surface 206 of electronic component 202. In one embodiment, backsides 214 are the lower circular flat ends of though vias 208 and thus are electrically conductive. However, in another embodiment, backsides 214 are curved or hemispherical as indicated by the dashed line 221 at the bottom of the through via 208 at the left of FIG. 2.

Backsides 214 are enclosed within backside dielectric sheath ends 220 of dielectric sheaths 210. Bulk 207 of electronic component 202, e.g., silicon, remains between backside dielectric sheath ends 220 and backside surface 206 of electronic component 202.

Figure 3:
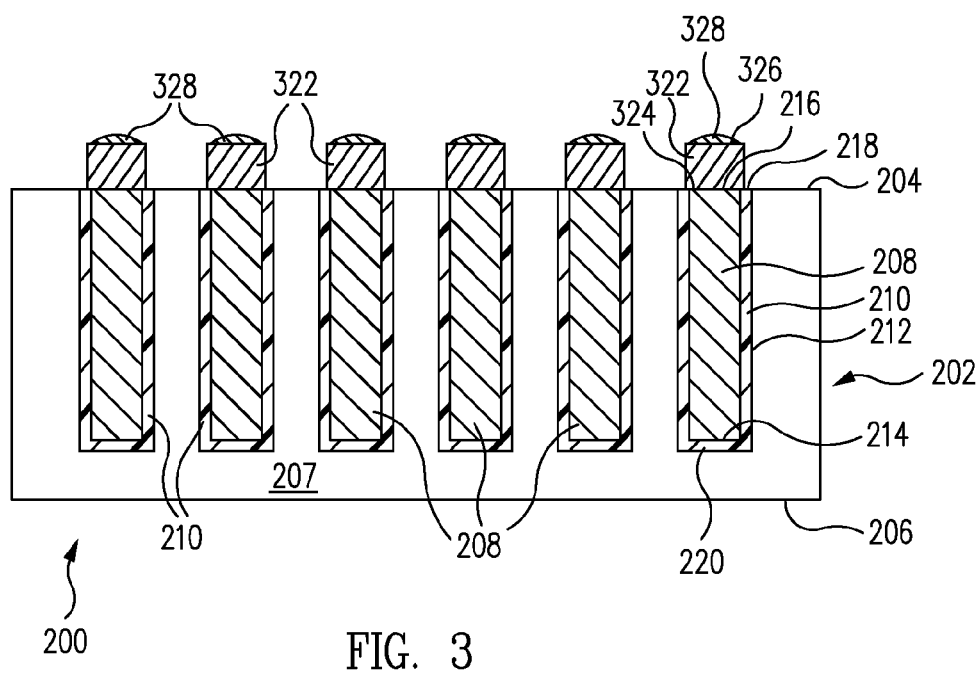
FIG. 3 is a cross-sectional view of the through via recessed reveal structure of FIG. 2 at a further stage during fabrication in accordance with one embodiment.

FIG. 3 is a cross-sectional view of through via recessed reveal structure 200 of FIG. 2 at a further stage during fabrication in accordance with one embodiment. Referring now to FIGS. 1, 2, and 3 together, in a form pillars on frontsides of through vias operation 102, pillars 322 are formed on frontsides 216 of through vias 208.

Although not illustrated, electronic component 202 can further include bond pads, sometimes called I/O terminals, on frontside surface 204 of electronic component 202. In accordance with this embodiment, pillars 322 can also be formed on the bond pads of electronic component 202.

Pillars 322 are formed of an electrically conductive material, e.g., are copper pillars. Pillars 322 are formed using any one of a number of pillar formation techniques, e.g., a copper pillar bumping process, and the particular technique used is not essential to this embodiment.

Pillars 322 include pillar bases 324 formed directly on and thus electrically connected to frontsides 216 of through vias 208. Pillars 322 further include pillar tips 326. Pillars 322 extend between pillar bases 324 and pillar tips 326. Generally, pillars 322 protrude from frontsides 216 of through vias 208.

In accordance with this embodiment, to facilitate physical and electrical mounting of pillars 322 to another structure as discussed further below, caps 328, e.g., solder caps, are formed on pillar tips 326. Generally, caps 328 have a lower melting temperature than pillars 322. Accordingly, caps 328 can bond pillars 322 to another structure using thermocompression (T/C) bonding, e.g., by applying heat and pressure on backside surface 206 of electronic component 202. In yet another embodiment, caps 328 can be reflowed, i.e., heated to a melt and then cooled, without melting of pillars 322.

Figure 4:
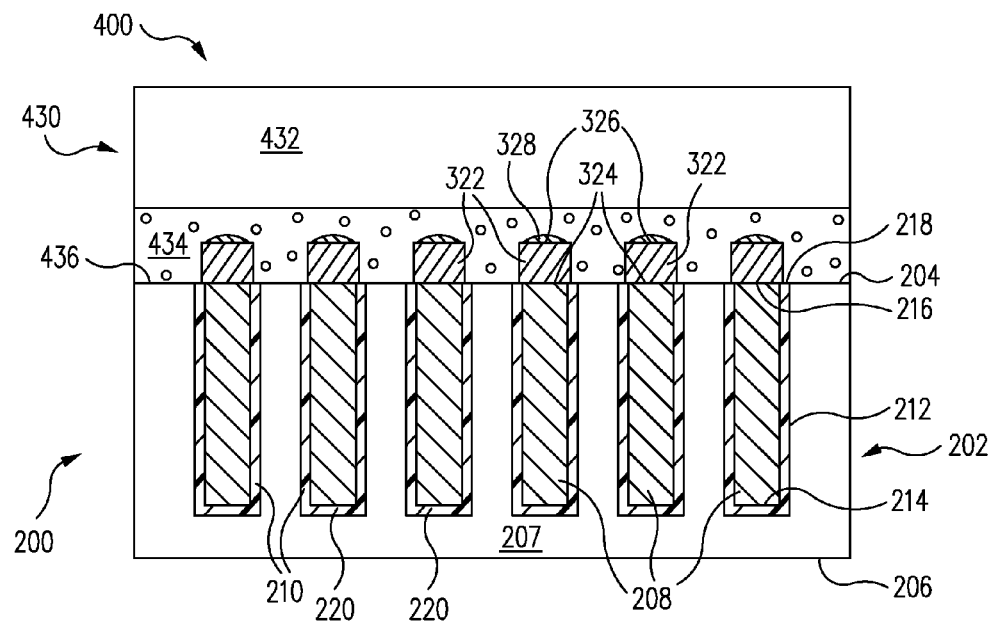
FIG. 4 is a cross-sectional view of an assembly including the through via recessed reveal structure of FIG. 3 at a later stage during fabrication in accordance with one embodiment.

FIG. 4 is a cross-sectional view of an assembly 400 including through via recessed reveal structure 200 of FIG. 3 at a later stage during fabrication in accordance with one embodiment. Referring now to FIGS. 1 and 4 together, from form pillars on frontsides of through vias operation 102, flow moves to a mount to Wafer Support System (WSS) operation 104. In mount to Wafer Support System (WSS) operation 104, through via recessed reveal structure 200 is mounted to a wafer support system 430.

Wafer support system 430 includes a rigid backplate 432 and a compliant layer 434. More particularly, compliant layer 434 is mounted to backplate 432. Compliant layer 434 includes an exposed outer surface 436.

Through via recessed reveal structure 200 is mounted to compliant layer 434, e.g., an adhesive. In accordance with this embodiment, compliant layer 434 is compliant, sometimes called soft or deformable. Further, compliant layer 434 is adhesive, e.g., is sticky, although in another embodiment, a separate adhesive is applied between through via recesses reveal structure 200 and compliant layer 434 to mount through via recesses reveal structure 200.

In accordance with this embodiment, frontside surface 204 including pillars 322 is mounted to compliant layer 434. Pillars 322 penetrate into outer surface 436 of compliant layer 434 and extend into compliant layer 434. Outer surface 436 thus directly contacts and adheres to frontside surface 204 of electronic component 202.

Once mounted, wafer support system 430 supports through via recessed reveal structure 200 for further processing as discussed further below.

Figure 5:
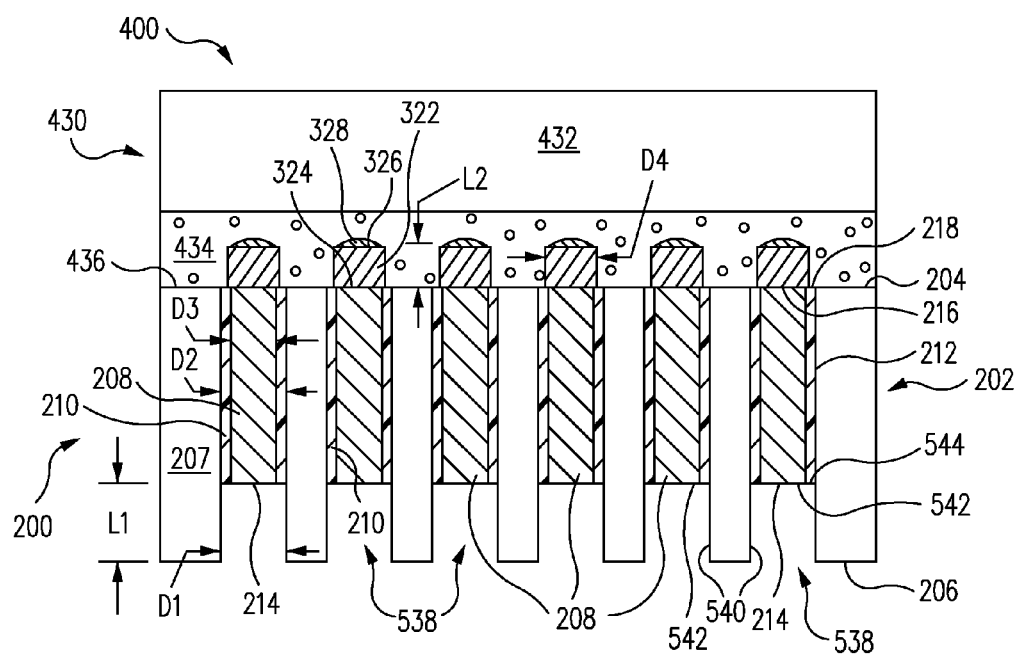
FIG. 5 is a cross-sectional view of the assembly including the through via recessed reveal structure of FIG. 4 at a later stage during fabrication in accordance with one embodiment.

FIG. 5 is a cross-sectional view of assembly 400 including through via recessed reveal structure 200 of FIG. 4 at a later stage during fabrication in accordance with one embodiment. Referring now to FIGS. 1, 4, and 5 together, from mount to Wafer Support System (WSS) operation 104, flow moves to a backgrind operation 106. In backgrind operation 106, backside surface 206 of electronic component 202 is backgrinded, i.e., removed.

Generally, in backgrind operation 106, electronic component 202 is thinned from backside surface 206. Electronic component 202 is thinned such that backside surface 206 is separated from backsides 214 of through vias 208 by a length L1 less than a length of pillars of a stack structure to be stacked on through via recessed reveal structure 200 as discussed further below. In one specific embodiment, electronic component 202 is thinned such that backside surface 206 is separated from backsides 214 of through vias 208 by a length L1 less than a length L2 of pillars 322 of through via recessed reveal structure 200, where length L2 of pillars 322 is the distance between pillar bases 324 and pillar tips 326.

From backgrind operation 106, flow moves to a form recesses to expose backsides of through vias operation 108. In form recesses to expose backsides of through vias operation 108, recesses 538 are formed in backside surface 206 of electronic component 202 to expose backsides 214 of through vias 208. Further, backside dielectric sheath ends 220 of dielectric sheaths 210 are removed during form recesses to expose backsides of through vias operation 108.

In one embodiment, to form recesses 538, backside surface 206 is drilled, e.g., with a mechanical drill and/or laser ablation (laser drill). More particularly, bulk 207 and backside dielectric sheath ends 220 are drilled from backside surface 206 to form recesses 538. The drilling removes bulk 207 and backside dielectric sheath ends 220 to expose backsides 214 of through vias 208 through recesses 538. Recesses 538 are sometimes called silicon recesses.

In another embodiment, recesses 538 are formed by etching backside surface 206. Illustratively, a patterned mask is formed on backside surface 206. Exposed portions of backside surface 206 are etched to form recesses 538.

In one embodiment, a first etch is performed to remove bulk 207 of electronic component 202, e.g., silicon. This first etch is followed by a second etch to remove backside dielectric sheath ends 220, e.g., silicon oxide, and expose backsides 214 of through vias 208 through recesses 538. Alternatively, both bulk 207 and backside dielectric sheath ends 220 are removed using a single etch process to expose backsides 214 of through vias 208 through recesses 538.

Generally, recesses 538 are aligned with backsides 214 of through vias 208. More particularly, recesses 538 are defined by recess sidewalls 540 and recess bases 542. Recess sidewalls 540 extend between backside surface 206 of electronic component 202 and recess bases 542.

Recess bases 542 are defined by backsides 214 of through vias 208 and annular backsides 544 of dielectric sheaths 210. In one embodiment, backsides 214 of through vias 208 are circular and backsides 544 of dielectric sheaths 210 are annuluses surrounding backsides 214 of through vias 208.

In one embodiment, the diameter D1 of recesses 538 is equal to the diameter D2 of dielectric sheaths 210. Accordingly, recess bases 542 are defined by the entire backsides 214 of through vias 208 and the entire backsides 544 of dielectric sheaths 210. However, those of skill in the art will understand that there may be a slight amount of misalignment between recess 538 and through vias 208 such that a portion(s) of backsides 214 and backsides 544 remain covered by bulk 207 of electronic component 202.

In one embodiment, for example to accommodate tolerance in alignment between recesses 538 and though vias 208, the diameter D1 of recesses 538 is greater than the diameter D2 of dielectric sheaths 210. In yet another embodiment, the diameter D1 of recesses 538 is less than the diameter D2 of dielectric sheaths 210, e.g., is equal to the diameter D3 of through vias 208.

Further, in one embodiment, the diameter D1 of recesses 538 is greater than the diameter D4 of pillars 322, e.g., diameter D4 is 10 µm, although has other dimensions in other examples. This allows pillars 322 to be inserted within recesses of another through via recessed reveal structure and/or to allow pillars of another through via recessed reveal structure, sometimes called a stacked structure, to be inserted within recesses 538.

FIG. 6 is a cross-sectional view of a stacked assembly 600 including through via recessed reveal structure 200 of FIG. 5 at a later stage during fabrication in accordance with one embodiment. Referring now to FIGS. 1 and 6 together, from form recesses to expose backsides of through vias operation 108, flow moves to an attach pillars of stacked structure to exposed backsides of through vias through recesses operation 110. In attach pillars of stacked structure to exposed backsides of through vias through recesses operation 110, pillars 322A of a stacked structure 200A are attached to exposed backsides 214 of through vias 208 through recesses 538 of through via recessed reveal structure 200.

In one embodiment, stacked structure 200A sometimes called through via recessed reveal structure 200A, is substantially similar or identical to through via recessed reveal structure 200. For example, stacked structure 200A is formed by performing operations 102, 104, 106, 108 as discussed above.

Thus, in accordance with this embodiment, stacked structure 200A includes an electronic component 202A, a frontside surface 204A, a backside surface 206A, a bulk 207A, through vias 208A, dielectric sheaths 210A, through via apertures 212A, backsides 214A, frontsides 216A, frontside dielectric sheath ends 218A, pillars 322A, pillar bases 324A, pillar tips 326A, caps 328A, recesses 538A, recess sidewalls 540A, recess bases 542A, and backsides 544A similar or identical to electronic component 202, frontside surface 204, backside surface 206, bulk 207, through vias 208, dielectric sheaths 210, through via apertures 212, backsides 214, frontsides 216, frontside dielectric sheath ends 218, pillars 322, pillar bases 324, pillar tips 326, caps 328, recesses 538, recess sidewalls 540, recess bases 542, and backsides 544 of through via recessed reveal structure 200, respectively, as discussed above.

As illustrated in FIG. 6, pillars 322A of stacked structure 200A extend into recesses 538 of through via recessed reveal structure 200. Pillar tips 326A of stacked structure 200A are physically and electrically connected to backsides 214 of through vias 208 of through via recessed reveal structure 200 by caps 328A of stacked structure 200A.

Illustratively, thermocompression bonding, e.g., applying heat and pressure to backside surface 206A of stacked structure 200A, is used to bond pillar tips 326A to backsides 214 with caps 328A. In another embodiment, stacked assembly 600 is heated to reflow caps 328A to mount stack structure 200A to through via recessed reveal structure 200.

In one embodiment, a nonconductive paste (NCP) 646 is located between backside surface 206 of through via recessed reveal structure 200 and frontside surface 204A of stacked structure 200A to further enhance mounting of stacked structure 200A to through via recessed reveal structure 200.

As further illustrated in FIG. 6, the diameter D1 of recesses 538 of through via recessed reveal structure 200 is greater than or approximately equal to the diameter D4 of pillars 322A of stacked structure 200A. This allows pillars 322A to be inserted into recesses 538.

Further, recesses 538 in combination with pillars 322A work as a lock and key arrangement to insure self-alignment of pillars 322A with backsides 214 of through vias 208. Accordingly, very fine pitch interconnections between pillars 322A and backsides 214 is achieved.

Further, the interconnections between frontsides 216A of through vias 208A of stacked structure 200A and backsides 214 of through vias 208 of through via recessed reveal structure 200 is formed essentially entirely within recesses 538 by pillars 322A and caps 328A. By forming the interconnections inside of the recesses 538, the distance between through via recesses reveal structure 200 and stacked structure 200A is minimized. More particularly, the distance between frontside surface 204A of stacked structure 200A and backside surface 206 of through via recessed reveal structure 200 is minimized. This allows the overall thickness of stacked assembly 600 to be minimized.

Further still, by forming the interconnections inside of the recesses 538 by pillars 322A and caps 328A as set forth above, copper migration for very fine features is minimized or eliminated. This, in turn, minimizes or eliminates shorting of adjacent through vias 208.

Although mounting a single stacked structure 200A to through via recessed reveal structure 200 is illustrated in FIG. 6 and discussed above, in light of this disclosure, those of skill in the art will understand that a plurality, e.g., two or more, stacked structures can be mounted to through via recessed reveal structure 200. For example, pillars of a second stacked structure can be inserted into recesses 538A and mounted to backsides 214A of through vias 208A of stacked structure 200A in a manner similar to that discussed above regarding mounting of stacked structure 200A to through via recessed reveal structure 200. This procedure can be repeated to stack additional stacked structures in a similar manner, for example, to form a memory cube. In various embodiments, the procedure is used for a memory application or a logic plus memory application.

Further, although mounting of stacked structure 200A to through via recessed reveal structure 200 is illustrated in FIG. 6 and discussed above, in light of this disclosure, those of skill in the art will understand that through via recessed reveal structure 200 can be stacked upon stacked structure 200A in a similar manner. In yet another embodiment, pillars 322 of through via recessed reveal structure 200 are mounted to a larger substrate, e.g., a printed circuit motherboard, by caps 328.

In one embodiment, electronic component 202 and electronic component 202A are singulated as individual electronic components, e.g., integrated circuit dies, prior to assembly. In accordance with this embodiment, stacked assembly 600 includes individual integrated circuit dies stacked upon one another. This is sometimes called a die to die assembly technique.

In another embodiment, electronic component 202 is one of plurality of electronic components integrally connected together as part of a larger substrate, e.g., a silicon wafer. The plurality of electronic components 202 are processed simultaneously or sequentially as set forth in operations 102, 104, 106, and 108 above. More generally, the larger substrate is processed as set forth above in operations 102, 104, 106, and 108 to form a plurality of through via recessed reveal structures 200 as illustrated in FIG. 6 yet integrally connected together as part of the larger substrate.

In one embodiment, an individual stacked structure 200A is mounted to each through via recessed reveal structure 200 of the larger substrate to form a plurality of stacked assembly 600 as illustrated in FIG. 6 yet integrally connected together. This is sometimes called a die to wafer assembly technique. The stacked assemblies 600 are then singulated from one another to form individual stacked assemblies 600 such as that illustrated in FIG. 6.

In yet another embodiment, stacked structure 200A is one of plurality of stacked structures 200A integrally connected together as part of a larger substrate, e.g., a silicon wafer. The larger substrate containing the stacked structures 200A is mounted to the larger substrate containing the through via recessed reveal structures 200 to form a plurality of stacked assembly 600 as illustrated in FIG. 6 yet integrally connected together. This is sometimes called a wafer to wafer assembly technique. The stacked assemblies 600 are then singulated from one another to form individual stacked assemblies 600 such as that illustrated in FIG. 6.

In one embodiment, through via recessed reveal structure 200 is removed from wafer support system 430 (see FIG. 5) prior to mounting of stacked structure 200A.

In another embodiment, stacked structure 200A is mounted to through via recessed reveal structure 200 while still mounted to wafer support system 430 (see FIG. 5), and then stacked assembly 600 is removed from wafer support system 430 (see FIG. 5).

Figure 7:
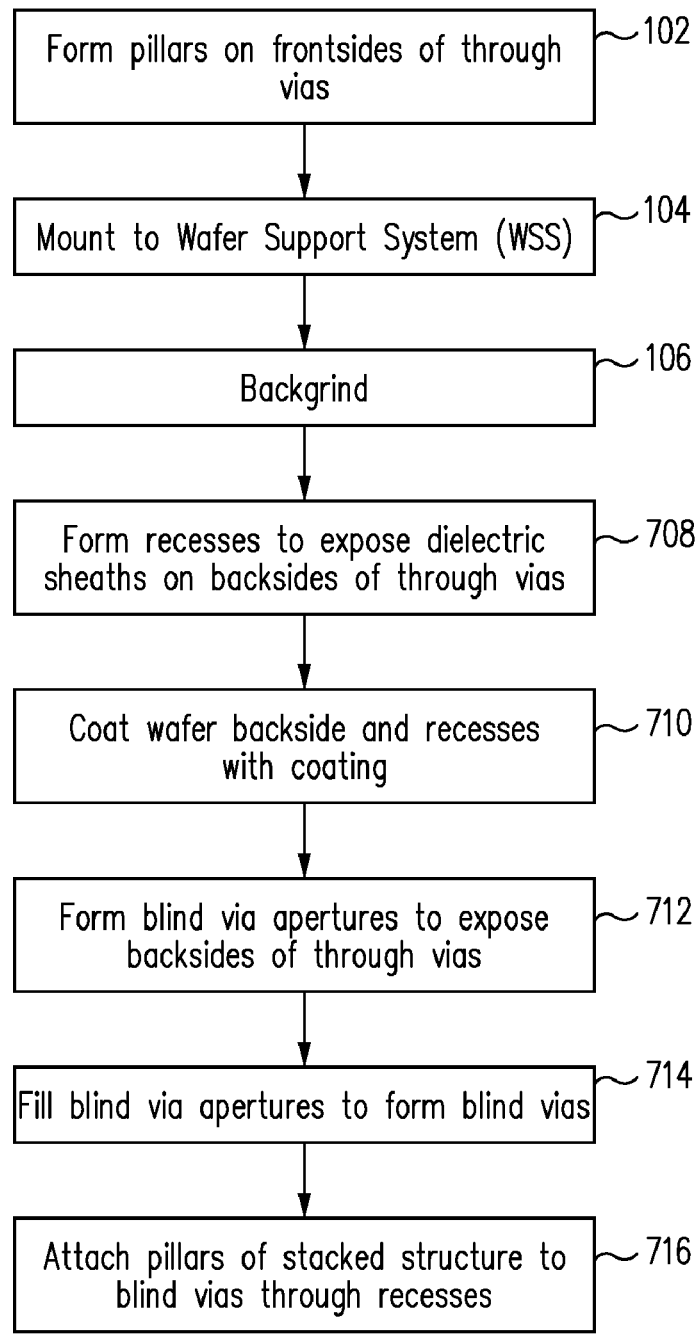
FIG. 7 is a block diagram of a through via recessed reveal structure formation method in accordance with another embodiment.

FIG. 7 is a block diagram of a through via recessed reveal structure formation method 700 in accordance with another embodiment. Form pillars on frontsides of through vias operation 102, mount to Wafer Support System (WSS) operation 104, and backgrind operation 106 of through via recessed reveal structure formation method 700 of FIG. 7 are similar or identical to form pillars on frontsides of through vias operation 102, mount to Wafer Support System (WSS) operation 104, and backgrind operation 106 of through via recessed reveal structure formation method 100 of FIG. 1 and so are only briefly discussed below.

Figure 8:
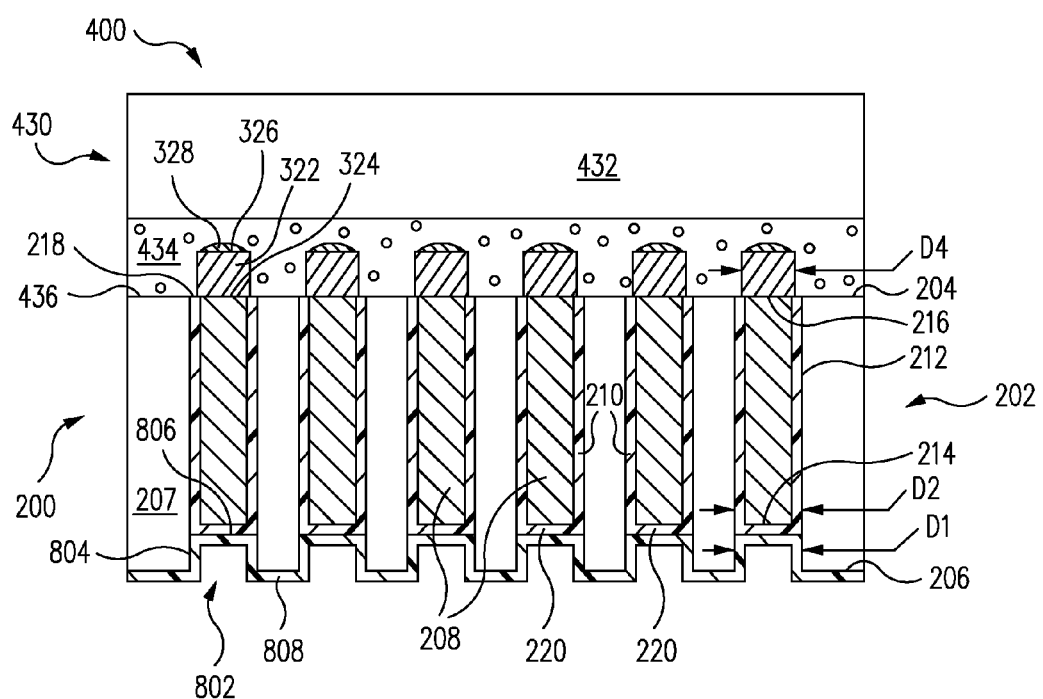
FIG. 8 is a cross-sectional view of the assembly including the through via recessed reveal structure of FIG. 4 at a later stage during fabrication in accordance with another embodiment.

FIG. 8 is a cross-sectional view of assembly 400 including through via recessed reveal structure 200 of FIG. 4 at a later stage during fabrication in accordance with another embodiment.

Referring now to FIGS. 7 and 8 together, in form pillars on frontsides of through vias operation 102, pillars 322 are formed on frontsides 216 of through vias 208 as discussed above. In mount to Wafer Support System (WSS) operation 104, through via recessed reveal structure 200 is mounted to wafer support system 430 as discussed above. In backgrind operation 106, backside surface 206 of electronic component 202 is backgrinded, e.g., removed, as discussed above.

From backgrind operation 106, flow moves to a form recesses to expose dielectric sheaths on backsides of through vias operation 708. In form recesses to expose dielectric sheaths on backsides of through vias operation 708, recesses 802 are formed in backside surface 206 of electronic component 202 to expose backside dielectric sheath ends 220 of dielectric sheaths 210 on backsides 214 of through vias 208. Form recesses to expose dielectric sheaths on backsides of through vias operation 708 is sometimes called a primary reveal operation.

In one embodiment, to form recesses 802, backside surface 206 is drilled, e.g., with a mechanical drill and/or laser ablation (laser drill). More particularly, bulk 207 is drilled from backside surface 206 to form recesses 802. The drilling removes bulk 207 to expose backside dielectric sheath ends 220 of dielectric sheaths 210 through recesses 802.

In another embodiment, recesses 802 are formed by etching backside surface 206. Illustratively, a patterned mask is formed on backside surface 206. Exposed portions of backside surface 206 are etched to form recesses 802. In one embodiment, the etch is a selective etch that removes bulk 207 of electronic component 202, e.g., silicon, but not dielectric sheaths 210, e.g., silicon oxide.

Generally, recesses 802 are aligned with backsides 214 of through vias 208. More particularly, recesses 802 are defined by recess sidewalls 804 and recess bases 806. Recess sidewalls 802 extend between backside surface 206 of electronic component 202 and recess bases 806.

Recess bases 806 are defined by backside dielectric sheath ends 220 of dielectric sheaths 210. In various embodiments, backside dielectric sheath ends 220 of dielectric sheaths 210 are flat, circular, curved, or hemispherical.

In one embodiment, the diameter D1 of recesses 802 is equal to the diameter D2 of dielectric sheaths 210. Accordingly, recess bases 806 are defined by the entire backside dielectric sheath ends 220 of dielectric sheaths 210. However, those of skill in the art will understand that there may be a slight amount of misalignment between recess 802 and backside dielectric sheath ends 220 of dielectric sheaths 210 such that a portion of backside dielectric sheath ends 220 of dielectric sheaths 210 remain covered by bulk 207 of electronic component 202.

In one embodiment, for example to accommodate tolerance in alignment between recesses 802 and dielectric sheaths 210, the diameter D1 of recesses 802 is greater than the diameter D2 of dielectric sheaths 210. In yet another embodiment, the diameter D1 of recesses 802 is less than the diameter D2 of dielectric sheaths 210.

Further, in one embodiment, the diameter D1 of recesses 802 is greater than the diameter D4 of pillars 322, e.g., diameter D4 is 10 μm, although has other dimensions in other examples.

From form recesses to expose dielectric sheaths on backsides of through vias operation 708, flow moves to a coat wafer backside and recesses with coating operation 710. In coat wafer backside and recesses with coating operation 710, backside surface 206 and recesses 802 are coated with a coating 808. More particularly, coating 808 is formed on the exposed backside surface 206, on recess sidewalls 804, and on recess bases 806, i.e., on backside dielectric sheath ends 220.

In one embodiment, coating 808 is an organic or inorganic barrier. For example, coating 808 is formed of an oxide such as silicon oxide or a nitride such as silicon nitride.

In one embodiment, coating 808 is a dielectric coating that electrically insulates bulk 207 from electrically conductive structures, e.g., pillars and caps, locate within recesses 802 as discussed further below.

In another embodiment, coating 808 is a conductive coating, e.g., a metal, that operates as an etch mask to protect dielectric sheaths 210 from being inadvertently etched between bulk 207 and through vias 208 thus avoiding shorting between bulk 207 and through vias 208. In this event, coating 808 is later removed as discussed below.

Figure 9:
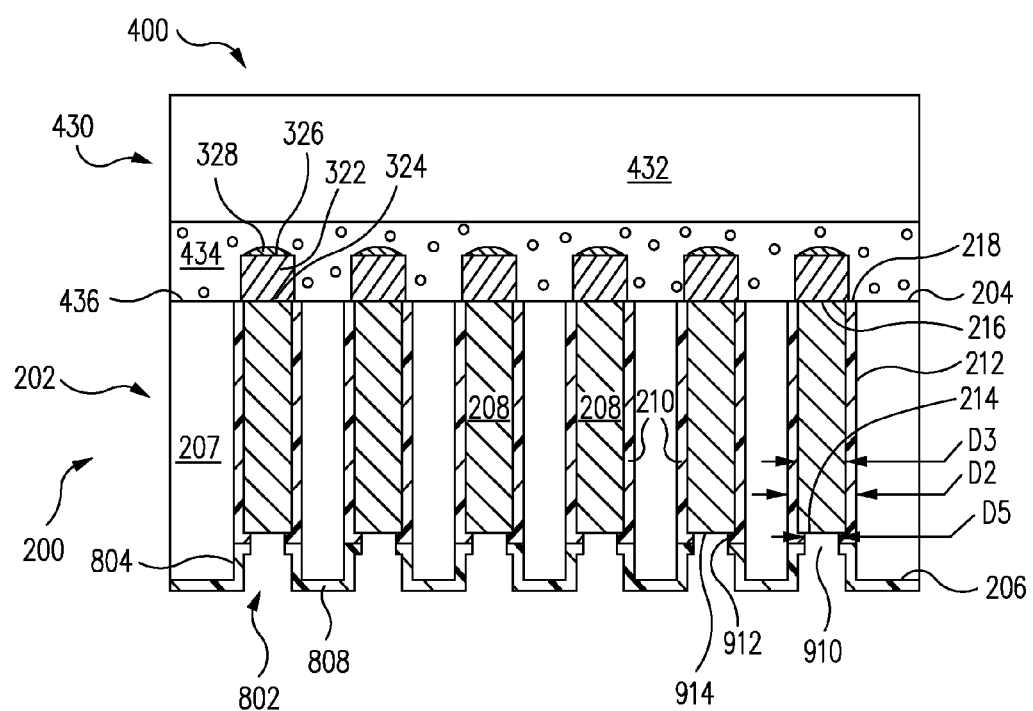
FIG. 9 is a cross-sectional view of the assembly including the through via recessed reveal structure of FIG. 8 at a later stage during fabrication in accordance with one embodiment.

FIG. 9 is a cross-sectional view of assembly 400 including through via recessed reveal structure 200 of FIG. 8 at a later stage during fabrication in accordance with one embodiment. Referring now to FIGS. 7, 8, and 9 together, from coat wafer backside and recesses with coating operation 710, flow moves to a form blind via apertures to expose backsides of through vias operation 712. In form blind via apertures to expose backsides of through vias operation 712, blind via apertures 910 are formed to expose backsides 214 of through vias 208. Form blind via apertures to expose backsides of through vias operation 712 is sometimes called a secondary reveal operation.

As illustrated in FIG. 9, blind via apertures 910 are formed in and extend through both coating 808 and backside dielectric sheath ends 220. Backsides 214 of through vias 208 are exposed to recesses 802 and thus to the ambient environment through blind via apertures 910.

In one embodiment, to form blind via apertures 910, coating 808 on recess bases 806 is drilled, e.g., with a mechanical drill and/or laser ablation (laser drill). More particularly, coating 808 and backside dielectric sheath ends 220 are drilled to form blind via apertures 910. The drilling removes coating 808 and backside dielectric sheath ends 220 to expose backsides 214 of through vias 208 through blind via apertures 910.

In another embodiment, recesses 538 are formed by etching coating 808 on recess bases 806. Illustratively, a patterned mask is formed on coating 808. Exposed portions of coating 808 and the underlying backside dielectric sheath ends 220 are etched to form blind via apertures 910.

In one embodiment, a first etch is performed to remove coating 808. This first etch is followed by a second etch to remove backside dielectric sheath ends 220, e.g., silicon oxide, and expose backsides 214 of through vias 208 through blind vias 910. During this second etch, coating 808 protects the underlying portions of dielectric sheaths 210. More particularly, coating 808 prevents inadvertently etching of dielectric sheaths 210 between bulk 207 and through vias 208 thus avoiding shorting between bulk 207 and through vias 208.

Alternatively, both coating 808 and backside dielectric sheath ends 220 are removed using a single etch process to expose backsides 214 of through vias 208 through blind via apertures 910.

Blind via apertures 910 are defined by blind via aperture sidewalls 912 and blind via aperture bases 914. Blind via apertures sidewalls 912 extend between coating 808 (and recesses 802) and blind via aperture bases 914.

Blind via aperture bases 914 are defined by backsides 214 of through vias 208. In one embodiment, the diameter D5 of blind via apertures 910 is equal to the diameter D3 of through vias 208 and thus less than the diameter D2 of dielectric sheaths 210. Accordingly, blind via aperture bases 914 are defined by the entire backsides 214 of through vias 208. However, those of skill in the art will understand that there may be a slight amount of misalignment between blind via apertures 910 and through vias 208.

However, in other embodiments, diameter D5 of blind via apertures 910 is greater than or less than the diameter D3 of through vias 208.

Figure 10:
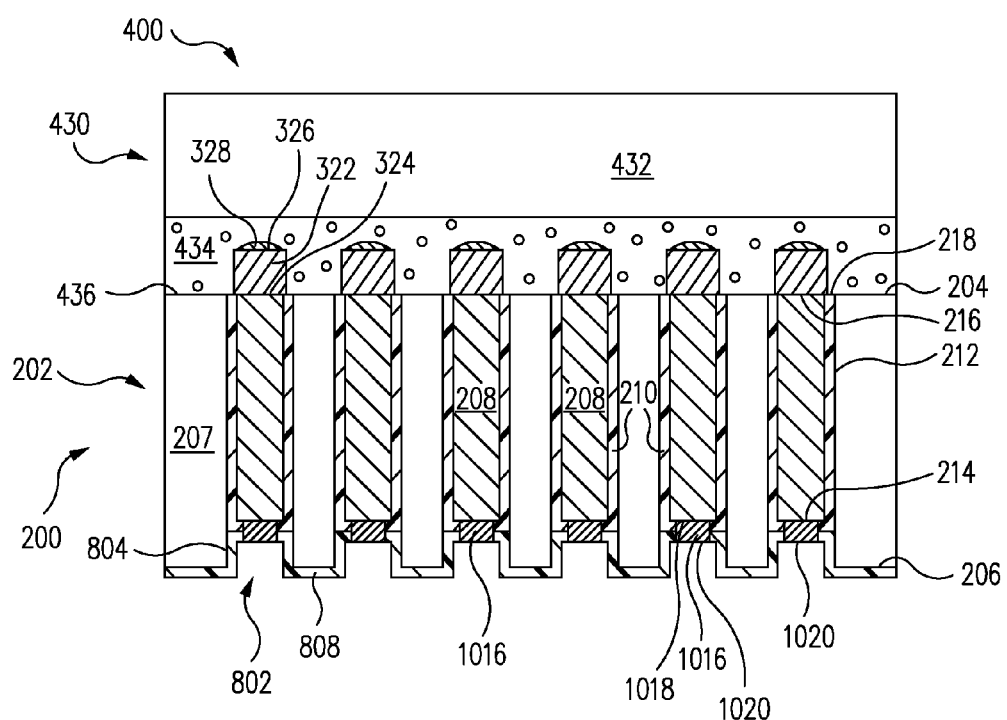
FIG. 10 is a cross-sectional view of the assembly including the through via recessed reveal structure of FIG. 9 at a later stage during fabrication in accordance with one embodiment.

FIG. 10 is a cross-sectional view of assembly 400 including through via recessed reveal structure 200 of FIG. 9 at a later stage during fabrication in accordance with one embodiment. Referring now to FIGS. 7, 9, and 10 together, from form blind via apertures to expose backsides of through vias operation 712, flow moves to a fill blind via apertures to form blind vias operation 714. In fill blind via apertures to form blind vias operation 714, blind via apertures 910 (FIG. 9) are filled with an electrically conductive material to form blind vias 1016 (FIG. 10).

Blind vias 1016 are formed directly on and thus electrically connected to backsides 214 of through vias 208. More particularly, blind vias 1016 extend between frontsides 1018 and backsides 1020 of blind vias 1016. Frontsides 1018 are formed directly on and thus electrically connected to backsides 214 of through vias 208. Backsides 1020 are exposed in recesses 802. Blind vias 1016 extend though dielectric sheaths 210 and coating 808 if present.

Figure 11:
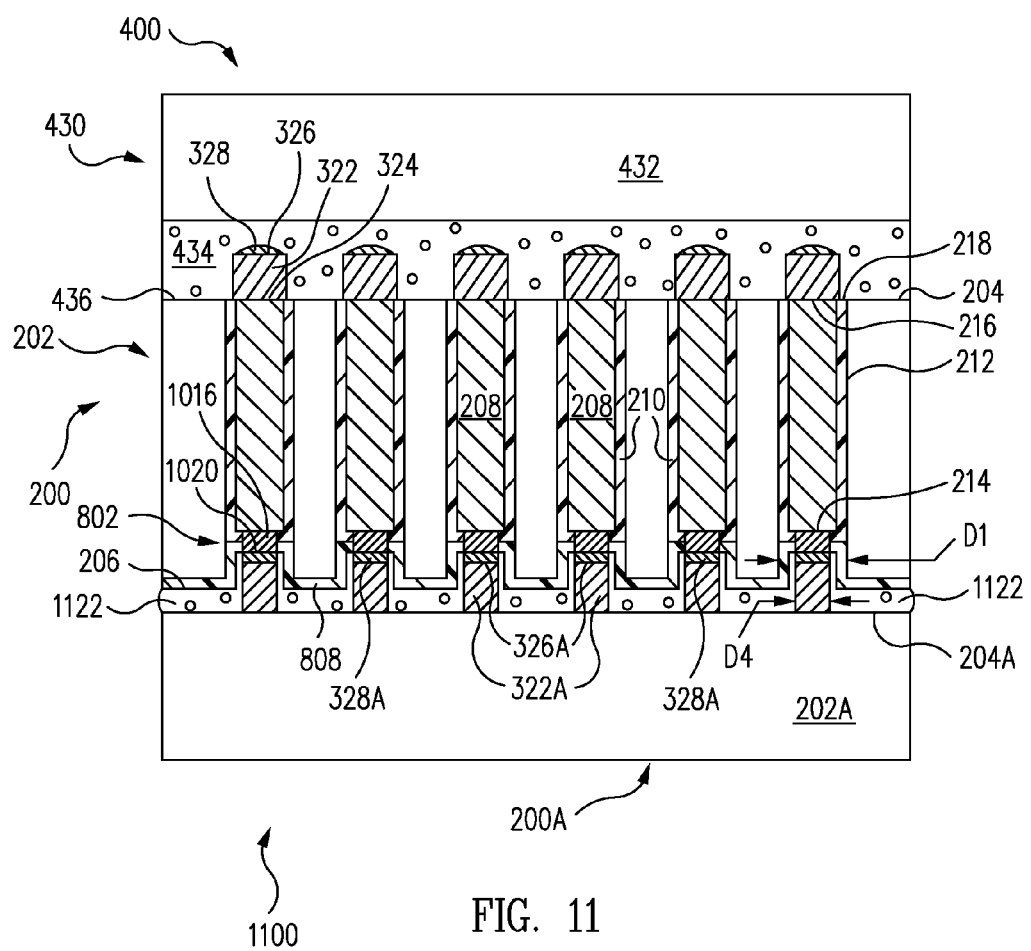
FIG. 11 is a cross-sectional view of a stacked assembly including the through via recessed reveal structure of FIG. 10 at a later stage during fabrication in accordance with another embodiment.

FIG. 11 is a cross-sectional view of a stacked assembly 1100 including assembly 400 including through via recessed reveal structure 200 of FIG. 10 at a later stage during fabrication in accordance with another embodiment. Referring now to FIGS. 7 and 11 together, from fill blind via apertures to form blind vias operation 714, flow moves to an attach pillars of stacked structure to blind vias through recesses operation 716. In attach pillars of stacked structure to blind vias through recesses operation 716, pillars 322A of a stacked structure 200A are attached to exposed backsides 1020 of blind vias 1016 through recesses 802 of through via recessed reveal structure 200.

In one embodiment, stacked structure 200A sometimes called through via recessed reveal structure 200A, is substantially similar or identical of through via recessed reveal structure 200. For example, stacked structure 200A is formed by performing operations 102, 104, 106, 708, 710, 712, 714 as discussed above. For simplicity, the detailed features of stacked structure 200A are not illustrated in FIG. 11.

As illustrated in FIG. 11, pillars 322A of stacked structure 200A extend into recesses 802 of through via recessed reveal structure 200. Pillar tips 326A of stacked structure 200A are physically and electrically connected to backsides 1020 of blind vias 1016. More generally, pillar tips 326A are connected to through vias 208 by caps 328A and blind vias 1016. Illustratively, stacked structure 200A is mounted to through via recessed reveal structure 200 of FIG. 11 in a manner similar to that discussed above regarding mounting of stacked structure 200A to through via recessed reveal structure 200 of FIG. 6.

In one embodiment, a nonconductive paste (NCP) 1122 is located between backside surface 206 of through via recessed reveal structure 200 and frontside surface 204A of stacked structure 200A to further enhance mounting of stacked structure 200A to through via recessed reveal structure 200.

As further illustrated in FIG. 11, the diameter D1 of recesses 802 of through via recessed reveal structure 200 is greater than or approximately equal to the diameter D4 of pillars 322A of stacked structure 200A. This allows pillars 322A to be inserted into recesses 802.

Further, recesses 802 in combination with pillars 322A work as a lock and key arrangement to insure self-alignment of pillars 322A with backsides 214 of through vias 208.

Accordingly, very fine pitch interconnections between pillars 322A and backsides 214 is achieved.

Further, the interconnections between stacked structure 200A and backsides 214 of through vias 208 of through via recessed reveal structure 200 is formed essentially entirely within recesses 802 by pillars 322A and caps 328A. By forming the interconnections inside of the recesses 802, the distance between through via recesses reveal structure 200 and stacked structure 200A is minimized. More particularly, the distance between frontside surface 204A of stacked structure 200A and backside surface 206 of through via recessed reveal structure 200 is minimized. This allows the overall thickness of stacked assembly 1100 to be minimized.

Further still, by forming the interconnections inside of the recesses 802 by pillars 322A and caps 328A as set forth above, copper migration for very fine features is minimized or eliminated. This, in turn, minimizes or eliminates shorting of adjacent through vias 208.

Although mounting a single stacked structure 200A to through via recessed reveal structure 200 is illustrated in FIG. 11 and discussed above, in light of this disclosure, those of skill in the art will understand that a plurality, e.g., two or more, stacked structures can be mounted to through via recessed reveal structure 200.

In various embodiments, stacked structure 200A can be stacked on through via recessed reveal structure 200 using a die to die assembly technique, a die to wafer assembly technique or a wafer to wafer assembly technique in a manner similar to that discussed above.

In one embodiment, stacked structure 200A is mounted to through via recessed reveal structure 200 while still mounted to wafer support system 430 as illustrated in FIG. 11 and then stacked assembly 1100 is removed from wafer support system 430. In another embodiment, through via recessed reveal structure 200 is removed from wafer support system 430 prior to mounting of stacked structure 200A.

Further, as discussed above, in one embodiment, coating 808 remains in the final assembly, i.e., in stacked assembly 1100. For example, coating 808 is a dielectric material. Accordingly, coating 808 prevents shorting between blind vias 1016, caps 328A, pillars 322A and bulk 207 of through via recessed reveal structure 200. Thus, coating 808 is not removed.

In yet another embodiment, coating 808 is removed after performance of form blind via apertures to expose backsides of through vias operation 712. For example, coating 808 is a barrier for protection of inadvertent etching of dielectric sheaths 210 between through vias 208 and bulk 207. Thus, after form blind vias to expose backsides of through vias operation 712, coating 808 is unnecessary and thus removed. In another example, coating 808 is electrically conductive and thus removed to avoid shorting to coating 808.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
    an electronic component comprising a frontside surface and an opposite backside surface;
    through vias formed within the electronic component, the through vias comprising frontsides and backsides;
    recesses formed within the backside surface of the electronic component to expose the backsides of the through vias; and
    dielectric sheaths enclosing the through vias, the dielectric sheaths electrically isolating the through vias from a bulk of the electronic component.

2. The structure of claim 1 further comprising pillars coupled to the frontsides of the through vias.

3. The structure of claim 2, wherein the pillars comprise pillar bases coupled to the frontsides of the through vias.

4. The structure of claim 1, wherein the recesses comprise recess sidewalls and recess bases, the recess sidewalls extending between the backside surface of the electronic component and the recess bases.

5. The structure of claim 4, wherein where the recess bases comprise the backsides of the through vias.

6. The structure of claim 1 further comprising a stacked structure comprising pillars coupled to the backsides of the through vias through the recesses.

7. A structure comprising:
    an electronic component comprising a frontside surface and an opposite backside surface;
    through vias formed within the electronic component, the through vias comprising frontsides and backsides;
    recesses formed within the backside surface of the electronic component to expose the backsides of the through vias;
    pillars coupled to the frontsides of the through vias, the pillars comprising:
    pillar bases coupled to the frontsides of the through vias; and
    pillar tips; and caps on the pillar tips.

8. A structure comprising:
    an electronic component comprising a frontside surface and an opposite backside surface;
    through vias formed within the electronic component, the through vias comprising frontsides and backsides;
    recesses formed within the backside surface of the electronic component to expose the backsides of the through vias; and
    a stacked structure comprising pillars coupled to the backsides of the through vias through the recesses,
    wherein the pillars of the stacked structure are coupled to the backsides of the through vias by caps of the stacked structure.

9. The structure of claim 6 further comprising a nonconductive paste between the stacked structure and the electronic component.

10. A structure comprising:
    an electronic component comprising a frontside surface and an opposite backside surface;
    through vias formed within the electronic component, the through vias comprising frontsides and backsides;
    blind vias formed on the backsides of the through vias; and
    recesses formed within the backside surface of the electronic component to expose the blind vias.

11. The structure of claim 10 further comprising dielectric sheaths enclosing the through vias, the blind vias extending through the dielectric sheaths.

12. The structure of claim 10 further comprising a coating on the backside surface of the electronic component and on recess sidewalls of the recesses.

13. The structure of claim 12, wherein the blind vias extend through the coating.

14. The structure of claim 10 further comprising pillars coupled to the frontsides of the through vias.

15. The structure of claim 10 further comprising a stacked structure comprising pillars coupled to the blind vias through the recesses.

16. A method comprising:

forming through vias within an electronic component, wherein the through vias comprise backsides buried within the electronic component; and forming recesses within a backside surface of the electronic component, the recesses being aligned with the backsides of the through vias, the recesses exposing dielectric sheaths on the backsides of the through vias.

17. The method of claim 16 further comprising:

coating the backside surface of the electronic component and the recesses with a coating;

forming blind via apertures through the coating and the dielectric sheaths to expose the backsides of the through vias; and forming blind vias within the blind via apertures.

* * * * *